US008582784B2

(12) United States Patent
Minnaar

(10) Patent No.: US 8,582,784 B2
(45) Date of Patent: Nov. 12, 2013

(54) METHOD AND DEVICE FOR EXTENSION OF LOW FREQUENCY OUTPUT FROM A LOUDSPEAKER

(75) Inventor: Paulus Jacobus Minnaar, Copenhagen (DK)

(73) Assignee: AM3D A/S, Aalborg (DK)

( * ) Notice: Subject to any disclaimer, the term of this patent is extended or adjusted under 35 U.S.C. 154(b) by 433 days.

(21) Appl. No.: 12/676,086

(22) PCT Filed: Aug. 20, 2008

(86) PCT No.: PCT/DK2008/050208
§ 371 (c)(1), (2), (4) Date: May 11, 2010

(87) PCT Pub. No.: WO2009/030235
PCT Pub. Date: Mar. 12, 2009

(65) Prior Publication Data

US 2010/0215192 A1 Aug. 26, 2010

(30) Foreign Application Priority Data

Sep. 3, 2007 (DK) ................................ 2007 01260

(51) Int. Cl.
*H03G 5/00* (2006.01)
*H03G 9/00* (2006.01)

(52) U.S. Cl.
USPC ........................................... 381/98; 381/102

(58) Field of Classification Search
USPC ....................................... 381/98–103, 56–59
See application file for complete search history.

(56) References Cited

U.S. PATENT DOCUMENTS

| | | |
|---|---|---|
| 4,249,042 A | 2/1981 | Orban |
| 4,739,514 A | 4/1988 | Short et al. |

(Continued)

FOREIGN PATENT DOCUMENTS

| | | |
|---|---|---|
| DE | 199 28 420 A1 | 12/2000 |
| EP | 0 583 492 B1 | 8/1992 |
| JP | 55 120205 | 9/1980 |

OTHER PUBLICATIONS

Application Report Texas Instruments, Oct. 2000, "Active Low-Pass Filter Design"; SLOA 049A, pp. 1-24.

(Continued)

*Primary Examiner* — Mohammad Islam
*Assistant Examiner* — David Ton
(74) *Attorney, Agent, or Firm* — Knobbe Martens Olson & Bear LLP.

(57) ABSTRACT

A method and device for enhancing low frequency content of an input signal (X), e.g. bass boosting of an audio signal. An overdriving (ODR) of a low frequency signal part (LS1) of the input signal (X) is performed to produce a boosted low frequency signal (LS3), wherein the overdriving (ODR) includes amplifying the low frequency signal part (LS1) by a first gain (G1) to form an amplified low frequency signal (LS2), and hard-clipping (CLP) the amplified low frequency signal (LS2) to form the boosted low frequency signal (LS3). A first low-pass filtering (LPF1) is then performed, resulting in a processed low frequency signal (LS4). A cut-off frequency of the first low-pass filtering (LPF1) is selected so as to reduce distortion components introduced by the overdriving (ODR). Finally, the processed low frequency signal (LS4) is combined with at least part of the input signal (X) to form an output signal (Y). Preferred embodiments further include adding a part of the input signal (X) after a gain (G2), to the low frequency signal part (LS1), hereby taking into account possible high frequency peak in the overdriving (ODR) process. Preferably, a second low-pass filter (LPF2) serves to low-pass filter the input signal (X) to form the low frequency signal part (LS1). A second cut-off frequency of the second low-pass filter (LPF2) is preferably selected coincident with the first cut-off frequency. Further, the first and second cut-off frequencies are preferably selected equal to, or within one octave from, a low frequency cut-off frequency for a loudspeaker intended to reproduce the output signal (Y). Thus, the preferred method introduces a level dependent bass boost below the loudspeaker s low frequency cut-off frequency.

15 Claims, 2 Drawing Sheets

(56) References Cited

U.S. PATENT DOCUMENTS

| | | | | |
|---|---|---|---|---|
| 5,361,381 | A | 11/1994 | Short | |
| 5,737,432 | A * | 4/1998 | Werrbach | 381/94.1 |
| 5,875,255 | A * | 2/1999 | Campbell | 381/345 |
| 7,764,796 | B2 * | 7/2010 | Lechner | 381/59 |
| 8,045,731 | B2 * | 10/2011 | Aoki et al. | 381/102 |
| 2004/0022400 | A1 | 2/2004 | Magrath | |
| 2008/0152168 | A1 * | 6/2008 | Magrath | 381/100 |

OTHER PUBLICATIONS

Micronas, "Application Note IC—MSP 34x0/x1/x2/x3G,MSP 44x0G, Micronas BASS", Edition May 28, 2003; 6251-530-1-2AN, pp. 1-6.

Notice of Position, issued in EP 2 191 660 B1, dated May 9, 2012, pp. 1-15.

* cited by examiner

METHOD AND DEVICE FOR EXTENSION OF LOW FREQUENCY OUTPUT FROM A LOUDSPEAKER

CROSS REFERENCE TO RELATED APPLICATIONS

This application claims the benefit and priority to and is a U.S. National Phase Application of PCT International Application Number PCT/DK2008/050208, filed on Aug. 20, 2008, designating the United States of America and published in the English language, which is an International Application of and claims the benefit of priority to Danish Patent Application No. PA 2007 01260, filed on Sep. 3, 2007. The disclosures of the above-referenced applications are hereby expressly incorporated by reference in their entireties.

FIELD OF THE INVENTION

The invention relates to the field of signal processing, especially processing of audio signals. More specifically the invention provides a method and a device for processing an audio signal with the purpose of extending low frequency output when reproduced by a loudspeaker.

BACKGROUND OF THE INVENTION

For many applications such as mobile phones, portable audio players or car audio systems etc., small loudspeakers are required to fit the small space available. Still, it is intended to be able to reproduce low frequency audio signals with such loudspeakers. A simple linear (i.e. signal level independent) equalizing to enhance the low frequency range of such small loudspeakers below its natural cut-off frequency often results in an unacceptable high electrical power in the low frequency region. This demands a large power amplifier, and the high power can result in distortion due to too large cone amplitudes of the loudspeaker diaphragm, or it may even result in permanent damage of the loudspeaker suspension or coil.

Some different non-linear signal processing methods have been proposed to pre-process an audio signal in order to enhance low frequency output from such small loudspeakers. Often such pre-processing is referred to as "bass enhancement" or "low frequency bandwidth extension". Audio bandwidth extension is known in the field of audio and described thoroughly e.g. in the book "Audio Bandwidth Extension" by Erik Larsen and Ronald M. Aarts, John Wiley & Sons Ltd. 2004, ISBN 0-470-85864-8. As described in this book, low frequency bandwidth extension can be obtained by utilizing psychoacoustic properties of the human auditory system, i.e. to provide the listener with the perception of a larger amount of low frequency content than is physically present. Many of such approaches are based on introducing a non-linearity. E.g. synthesizing pure tones at frequencies well above the low cut-off frequency of the loudspeaker, wherein the pure tones are selected such that the human brain is "cheated" to perceive a low frequency tone which may not at all be physically present. On page 61 of the mentioned book, in a common approach it is mentioned as a requirement that the original signal spectrum is maintained at all signal levels, i.e. amplitude linearity.

U.S. Pat. No. 6,678,380 by Philips describes an audio system comprising a circuit for processing an audio signal, whereby the circuit comprises a harmonics generator coupled to the input for generating harmonics of the audio signal, and adding means coupled to the input as well as to the harmonics generator for supplying a sum of the audio signal and the generated harmonics to the output. It is claimed that an auditory illusion can be created by replacing low-frequency tones, by harmonics of these tones. Thus, in essence the harmonics are added so as to give the impression of bass tones that can not be reproduced by a small loudspeaker.

U.S. Pat. No. 5,359,665 by Aphex describes another bass enhancement system including a bass compressor having a variable gain amplifier controlling gain controlled by a signal level detector sensing the level of the bass components. In this way high bass amplification is provided at low bass levels, while less bass amplification is provided at higher bass levels. In general, compressors are used for reducing the dynamics of a signal. Thus the difference between the quiet parts and the loud parts is lessened, and thus the overall signal can be boosted. In order to optimise the compressor so-called attack and release times have to be set.

The mentioned approaches may result in acceptable sound quality in case of low frequency pure tones. However, since US 2003/0044023 A1 adds pure tones at higher frequencies in all cases, this can result in an unacceptable low sound quality due to highly audible intermodulation distortion. The compressor solution in U.S. Pat. No. 5,359,665 can result in audible "pumping" effects, due to the inherent problem of using attack- and release times, thereby providing a rather poor sound quality. Further, for application within low cost miniature equipment, the methods require too much signal processing power to be acceptable.

SUMMARY OF THE INVENTION

It may be seen as an object of the present invention to provide a method and device capable of improving low frequency output of small loudspeakers without causing distortion or damaging the loudspeaker unit. Further, the method must be simple to implement so as to fit e.g. low cost miniature applications.

In a first aspect, the invention provides a method of enhancing the low frequency content of an input signal, including a) performing an overdriving of a low frequency signal part of the input signal to form a boosted low frequency signal, wherein the overdriving includes amplifying the low frequency signal part by a first gain to form an amplified low frequency signal, and hard-clipping the amplified low frequency signal to form the boosted low frequency signal, b) performing a first low-pass filtering of the boosted low frequency signal to form a processed low frequency signal, wherein a first cut-off frequency of the first low-pass filtering is selected so as to reduce distortion components introduced by the overdriving, and c) combining the processed low frequency signal with at least part of the input signal to form an output signal.

By 'hard-clipping' is understood applying a pure gain and a saturation of the signal at a predefined maximum level. By employing hard-clipping, low level signals will be increased by a linear gain whereas high level signals will be hard-clipped at the predefined maximum level. In digital implementations, hard-clipping may be implemented by using digital values +1 and −1 as maximum and minimum values, respectively. In analog implementations plus and minus signal full scale, e.g. plus and minus supply voltage, may be used as the clipping values.

The method is advantageous for processing audio signals with the purpose of increasing low frequency output of a small loudspeaker, also below its natural cut-off frequency. With the overdriving, it is possible to boost the low frequency part of the signal considerably to obtain a larger low frequency output, while too high low frequency signal amplitudes that may damage the loudspeaker or cause distortion are eliminated or at least the risk is highly reduced. Further, no distortion components in the form of high frequency tones are added to the signal in spite of the clipping due to the subsequent low-pass filtering in step b).

Thus, contrary to the teaching in the art regarding bass enhancement, it is possible with the present use of overdriving including hard-clipping to obtain a high sound quality. The method provides a high signal quality for all low frequency signal types and at all levels, and the clipping enables control of the maximum level applied to a loudspeaker reproducing the output signal, thereby protecting the loudspeaker even though the low frequency range is boosted significantly. At lower signal levels the overdriving implements a linear gain. Thus it acts as a simple linear bass boost, which does not introduce any undesirable artifacts.

The method, including the hard-clipping overdriving, can be implemented by few and simple processing steps. Thus the method is simple to implement in devices with only a limited signal processing capacity. The hard-clipping overdriving is a very simple implementation of the overdriving, and still the clipping serves to protect a connected electro-acoustic transducer by limiting the possible levels of the output signal. At low signal levels well below the clipping point no undesirable effects are heard, since at such levels the processing is a simple linear bass boost with the boost determined by the first gain. The first gain may be chosen to be in the range +3 dB to +30 dB, such as in the range +6 dB to +20 dB, such as in the range +8 dB to +16 dB, thereby enabling a significant effective bass boost is obtain, at least at low signal levels. At high signal levels the effective bass boost is reduced due to the overdriving effect, thereby protecting the following electro-acoustic transducer.

In preferred embodiments, a second low-pass filtering of the input signal is included so as to provide the low frequency signal part. A second cut-off frequency of the second low-pass filtering may be substantially equal to the first cut-off frequency of the first low-pass filtering, such as within ⅓-octave, such as within 1/12-octave.

In preferred embodiments, the first cut-off frequency is selected such that it is within one octave around a low frequency cut-off frequency of an associated electro-acoustic transducer, e.g. a loudspeaker, intended to convert the output signal to an acoustic signal. Especially, the first cut-off frequency may be substantially equal to the low frequency cut-off frequency of the associated electro-acoustic transducer. With such a choice of the first cut-off frequency, it is ensured, that the processing has its effect below the low frequency cut-off of the transducer. To ensure proper attenuation of distortion components, the first low-pass filtering has a cut-off steepness of at least 12 dB per octave, such as at least 18 dB per octave, such as 24 dB per octave or even more.

In preferred embodiments, at least a portion of the input signal is combined with the low frequency signal part prior to performing the overdriving. Preferably the portion of the input signal includes a high frequency portion of the input signal. Hereby, possible high frequency peaks are taken into account in the overdriving process. This effectively leads to a lower boost of the low frequency signal, thus serving to reduce the risk of clipping distortion in the output signal. Especially, a second gain may be applied to the input signal before being combined with the low frequency signal part. The second gain main be in the range −20 dB to 0 dB, such as −10 dB to −3 dB. A high-pass filtering of the input signal to form a high frequency signal part is preferred prior to combining with the low frequency signal part. This high frequency signal part can then be combined, in step c), with the processed low frequency signal to form the output signal. The high-pass filtering may be chosen to have a cut-off frequency substantially equal to the first cut-off frequency, such as within ⅓-octave, such as within 1/12-octave.

A further high-pass filtering may be included prior to performing the overdriving, such as high-pass filtering the input signal, or such as high-pass filtering the low frequency signal part. A cut-off frequency of this further high-pass filtering is preferably lower than the first cut-off frequency, such as one octave lower than the first cut-off frequency, or such as 2 octaves lower than the first cut-off frequency. Thereby this further high-pass filter can be used to protect a very small electro-acoustic transducer from high level frequency content significantly below its natural cut-off frequency.

To further reduce the risk of signal overload and thereby distortion in the output signal, the method may include applying a third gain of less than zero dB after step b). This third gain may be introduced just after the overdriving, before the first low-pass filtering. The third gain can be chosen to be in the range −10 dB to −1 dB, such as in the range −8 dB to −2 dB, such as in the range −6 dB to −3 dB.

Still to protect against overload distortion in the output signal, the method may further include performing a signal clipping, e.g. hard-clipping, after combining the signals in step c).

It may be preferred to boost the low frequency signal part purely by the mentioned first gain. However, it may also for some applications be preferred to provide a low frequency shaping filtering arranged to shape a frequency weighting of the processed low frequency signal. It may be selected to introduce this low frequency shaping filtering at any desired part of the signal processing.

In order to increase the dynamic headroom available for the low frequency enhancement, the method may include attenuating the input signal prior to performing step a). In case the input signal has a level which is already close to full scale, the overdriving of the low frequency signal part will serve to limit the signal level most of the time, and thereby no significant bass boost is obtained. Thus, by attenuating the input signal, such as by 3 dB or 6 dB, a considerable increased bass boost can be obtained.

In preferred embodiments, the method is implemented using simple signal processing steps such as: a simple gain, signal addition, low-pass filtering, and hard-clipping. Complicated limiter or compressor processing can be avoided, and thus the method works sample-by-sample. Thus, the method is suited to implement either on a digital signal processor with limited processing capacity, or the method may be implemented in an analog electronic circuit, or in a combination of analog and digital processing means.

The method may be implemented in computer executable program code. This code can be present in any computer-readable medium, such as any type of memory, hard disc, portable disc, or memory card etc.

In a second aspect the invention provides a signal processor arranged to perform the method according to the first aspect.

In a third aspect, the invention provides a device including a signal processor according to the second aspect. The device may be such as an audio device, a communication device, a car audio device, a home audio device, a headphone, a personal computer, a TV set, a personal media player (PMP), a gaming console, a hearing aid, a hi-fi device, and accessories to any of the mentioned devices.

In a fourth aspect, the invention provides a system including a device according to the third aspect, and a loudspeaker arranged to receive the output signal and convert it to a corresponding acoustic signal.

It is appreciated that all of the mentioned aspects can be combined in any way, and that embodiments and advantages mentioned in connection with the first aspect also apply to the second, third and fourth aspects.

BRIEF DESCRIPTION OF DRAWINGS

In the following, the invention will be described in more details by referring to the drawings in which.

DETAILED DESCRIPTION OF THE INVENTION

Figure 1:
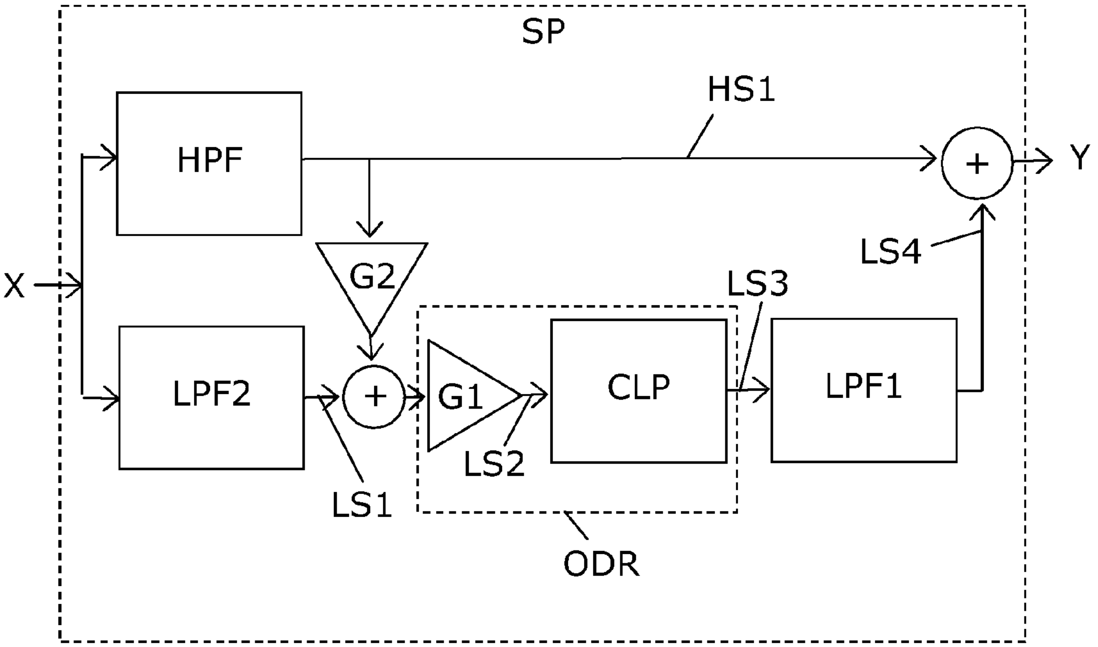
FIG. 1 illustrates a signal block diagram of basic parts of a preferred embodiment.

FIG. 1 illustrates a signal processor SP receiving an input signal X. In this embodiment, the input signal X is split into a low frequency signal part LS1 and a high frequency signal part HS1, where the low frequency signal part LS1 is further processed, while the high frequency signal part HS1 is not further processed. In FIG. 1 the splitting is performed by means of a low-pass filter LPF2 and a high-pass filter HPF. The splitting into LS1 and HS1 may be obtained in alternative implementations, such as will be described in connection with FIGS. 3 and 4. Further, it is to be understood that the splitting is optional, and thus the high-pass filter HPF can be completely left out, thus leaving HS1 identical with the input signal X. Low-pass filter LPF2 can in principle be left out as well, but it is included in preferred embodiments to provide the low frequency signal part LS1 intended for bass boost. In case the splitting is implemented, the two filters LPF2 and HPF may be designed to have one common cut-off frequency, and their cut-off rates may be at least 6 dB per octave, such as 12 dB per octave or more. The low-pass filter LPF2 preferably has a first cut-off frequency selected such that it coincides with the natural low frequency cut-off frequency of the loudspeaker to reproduce the output signal Y from the signal processor SP. Hereby the low frequency signal part LS1 is chosen such that the bass boost processing is performed at frequencies below the cut-off frequency for the loudspeaker.

In FIG. 1 the overdriving ODR is implemented as a simple gain up G1 followed by a non-linear clipping process CLP, which indicates hard-clipping. The low frequency signal part LS1 is amplified by gain G1 which in preferred embodiments is in the range 10-15 dB, thus introducing a substantial linear bass boost, preferably below the cut-off frequency of the loudspeaker, as described above. The amplified low frequency signal LS2 is then clipped CLP, such as digital hard-clipped, either to digital +1/−1, or hard-clipped to a predetermined lower level such as +0.9/−0.9.

The hard-clipping CLP serves to ensure that the bass boost provided by G1 does not result in an output signal Y leading to too high excursions of the loudspeaker diaphragm causing distortion and possible damage of the loudspeaker. The hard-clipping CLP itself, however, introduces distortion. Thus, after hard-clipping CLP, the boosted low frequency signal LS3 is filtered by low-pass filter LPF1. The function of this low-pass filter LPF1 is to eliminate or at least significantly reduce high frequency distortion components introduced by the non-linear hard-clipping CLP process. Preferably, the cut-off frequency of this low-pass filter LPF1 is selected approximately equal to the cut-off frequency of low-pass filter LPF2, or possibly slightly lower or slightly higher. Further, it is preferred that the cut-off frequency of low-pass filter LPF1 is less than one octave higher than the low frequency cut-off frequency of the loudspeaker, preferably less than ⅓ octave higher than the loudspeaker cut-off frequency. Low-pass filter LPF1 may be implemented digitally as two, preferably three or four cascaded Infinite Impulse Response (IIR) low-pass filter sections in order to provide a steep cut-off towards high frequencies, thereby ensuring that high frequency distortion components are effectively attenuated.

After low-pass filtering LPF1, the resulting processed low frequency signal LS4 is combined with the high frequency signal part HS1 by simple signal addition so as to form the output signal Y, which can be amplified subsequently and applied to an electro-acoustic transducer such as a loudspeaker, as mentioned, or a headphone etc.

Adding the two signals LS4 and HS1, where the processed low frequency signal LS4 may in some cases have an amplitude corresponding to full scale, the output signal Y may reach an amplitude above full scale. Thus, in preferred embodiments, a part of the input signal X is added to the low frequency signal part LS1 before the overdriving ODR, or at least before the hard-clipping CLP. Thereby, possible high frequency components are taken into account in the clipping, thus effectively reducing the level of the processed low frequency signal LS4 before addition with the remaining part HS1 of the input signal X. In FIG. 1 this is implemented with adding a part of HS1 to LS1 before the bass boost gain G1 and thereby also before the hard-clipping CLP. Gain G2 serves to set the portion of HS1 which is taken into account in the clipping. In preferred embodiments G2 is in the range −6 dB to 0 dB.

Figure 2A:
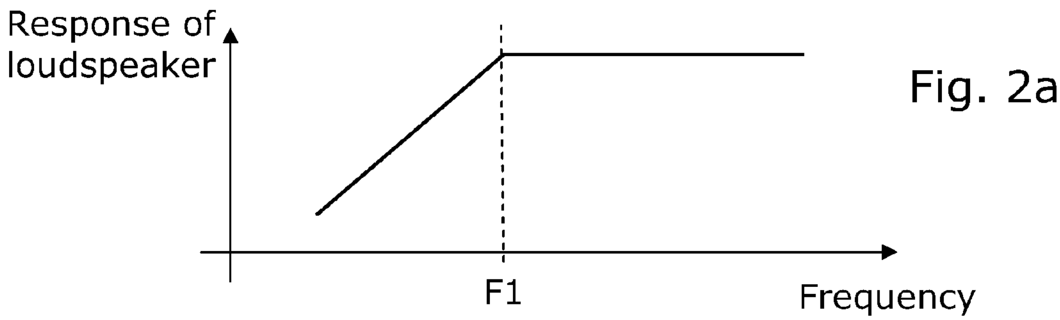
FIG. 2*a* illustrates in schematic form a frequency response of a typical loudspeaker with a low frequency cut-off.
Figure 2B:
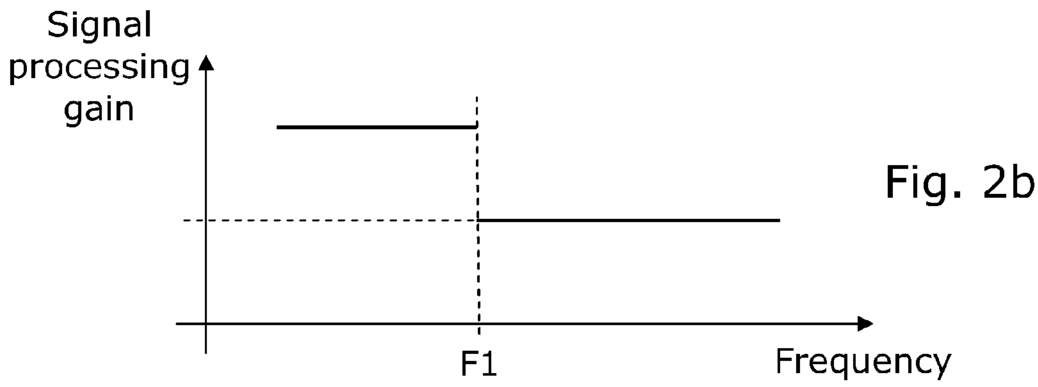
FIG. 2*b* illustrates preferred bass boost according to the invention in order to provide an optimal result with a typical loudspeaker.

FIGS. 2*a* and 2*b* serve to illustrate preferred interrelations between the properties of an electro-acoustic transducer, e.g. a loudspeaker, intended to convert the output signal Y to a corresponding acoustic signal and the signal processing SP. FIG. 2*a* illustrates a frequency response of a typical loudspeaker with a low frequency cut-off F1. According to prior art teaching, a perceived bass boost is normally obtained by introducing harmonic tones above F1, while leaving the frequency range below F1 unprocessed in order to protect the loudspeaker from high levels below F1.

In contrast to the prior art teaching, the processing according to preferred embodiments of the invention provide a gain below F1, such as illustrated in FIG. 2*b*, while the range above F1 is preferably unprocessed by the bass enhancement. Preferably, a linear gain of 10 dB to 15 dB below F1 is provided. This gives an improved bass output at moderate sound levels, while the hard-clipping CLP serves to limit the bass output at high signal levels.

In case of transducers with F1 above 150-200 Hz, it is preferred to have, at some point in the signal path, a high-pass filter serving to reduce signal amplitudes in the output signal Y at frequencies below e.g. 1-2 octaves under F1.

In the embodiment illustrated in FIG. 1, the cut-off frequencies for two low-pass filters LPF1 and LPF2 may both be selected to be equal to, or substantially equal to, the loudspeaker cut-off frequency F1. Further, the cut-off frequency for high-pass filter HPF may also be selected to be equal to, or substantially equal to, the loudspeaker cut-off frequency F1. Thus, in such embodiment, the input signal X is effectively split by a cross-over network around F1.

Figure 3:
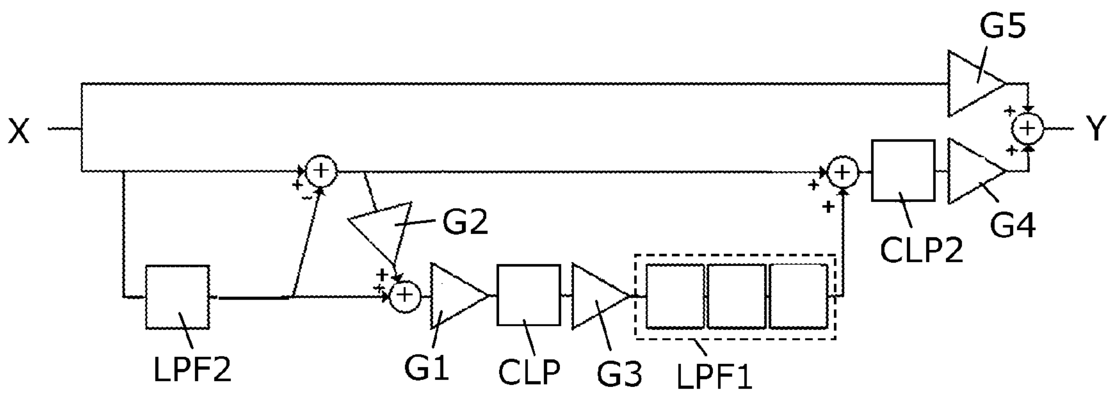
FIG. 3 illustrates an implementation example.

FIG. 3 illustrates a block diagram which in more details describes a preferred embodiment suited for implementation on a digital signal processor with limited capacity, since only gains, signal additions, low-pass filters and simple hard-clipping are involved. For explanation of reference signs X, Y, G1, G2, CLP, LPF1 and LPF2, see description related to FIG. 1 above, since in the embodiment of FIG. 3 these parts have essentially the same function as described for FIG. 1. As in FIG. 1, the embodiment of FIG. 3 is based on an overdriving implemented by means of gain G1 and hard-clipping CLP.

In FIG. 3 there is no splitting of the input signal X into a high frequency part and a low frequency part as in FIG. 1. However, low-pass filter LPF2 essentially serves the same purpose as in FIG. 1, namely to provide the low frequency signal part to be boosted by gain G1. Further, low-pass filter LPF2 is used to implement a high-pass filtering effect, since after LPF2 the low-pass filtered version of the input signal X is subtracted from the input signal X (note the signs '+' or '−' assigned to the signal at the signal addition points). The high-pass filtered signal part is used to provide a high frequency input to the overdriving ODR, which in the present embodiment means before the hard-clipping CLP. This effectively reduces the amount by which the low frequency signal LS1 is boosted by the overdriving ODR to form the low frequency signal LS3. Thereby the risk of subsequent signal overload is reduced. This high frequency input is added to the low frequency signal part via gain G2, before gain G1, such as described also in relation to FIG. 1. With appropriate choice of G2, this addition of the high frequency input may alternatively be placed after G1, i.e. just before the hard-clipping CLP.

In FIG. 3 the low-pass filter LPF1 is sketched as including a cascade of three first order Infinite Impulse Response (IIR) low-pass filters, preferably all with the same filter coefficients. Such IIR filters only require a limited processing power compared to Finite Impulse Response (FIR) filters. However, FIR filters may also be used if the necessary processing capacity is present. LPF2 may be a single first order IIR low-pass filter.

A gain G3 is included to further scale down the signal level before low-pass filtering in LPF1. This is done to further reduce the risk of signal overload in the low-pass filtering LPF1 process. G3 may be selected in the range −10 dB to −1 dB.

To further ensure that the output signal Y is not distorted due to overload, a second clipping CLP2, e.g. a hard-clipping, is included after the adding of the processed low frequency part to the high-pass filtered part of the input signal X. After the second clipping CLP2, the final output signal Y is formed as a mix of the input signal X and clipped processed combined signal. Gains G4 and G5 are not part of the crucial signal processing. These gains G4, G5 merely serve to provide the possibility of gradually switching from the output signal Y being "unprocessed" to "processed with the signal processor SP". For this purpose, G4 and G5 are preferably selected such that G5=1−G4 (in absolute gain values). Thus, for G4=1 (absolute value), "processed with the signal processor SP" is selected, while "unprocessed" is selected if G4=0 (absolute value).

Figure 4:
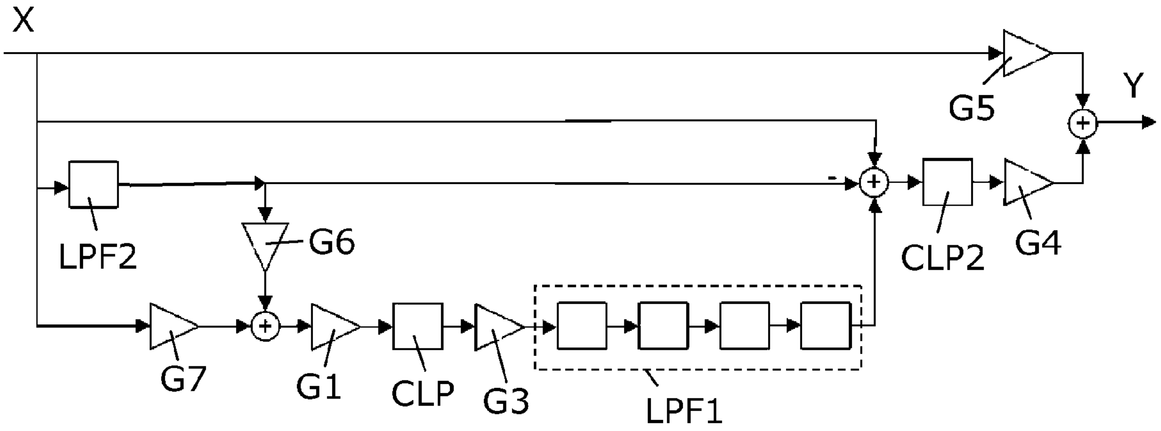
FIG. 4 illustrates another implementation example.

FIG. 4 illustrates another implementation example in which one addition point is saved compared to the implementation shown in FIG. 3. Functions of reference signs G1, G3, CLP, LPF1, LPF2, CLP2, G4 and G5 are as described for FIG. 3. LPF1, however is here sketched as a cascade of four first order IIR low-pass filters. G6 and G7 are introduced instead of G2 in FIG. 3, i.e. to control the mix of the low frequency signal portion and in this case a linear portion of the input signal which are added prior to the overdriving process.

Figure 5:
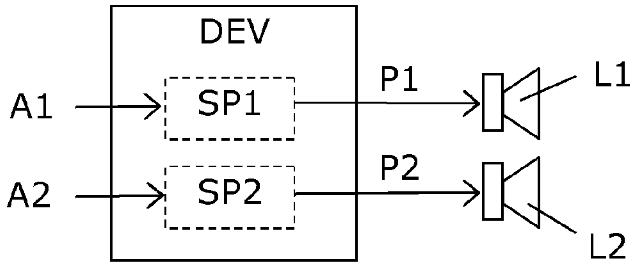
FIG. 5 illustrates a two-channel system according to the invention.

FIG. 5 illustrates a system embodiment formed by a device DEV, such as a mobile communication device. The device is arranged to receive two audio input signals A1, A2 which are processed by respective signal processors SP1, SP2 which can be implemented such as described above. Respective output signals P1, P2 are then applied to respective loudspeakers L1, L2 which generate respective first and second acoustic output signals. The input audio signals A1, A2 may be a set of stereo signals, or binaural signals etc. The two signal processors SP1, SP2 are preferably identical. The device may include further signal processing, e.g. stereo enhancement processing serving to enhance a perceived stereo image from the loudspeakers L1, L2 even though they are closely spaced. The embodiment of FIG. 5 can in general be extended to include a plurality of signal processors according to the invention, each processing an input signal and providing a corresponding output signal, such as for multi-channel purposes in surround sound equipment, car audio system etc. In alternative multi-channel embodiments, the signal processors may also share some of the signals LS1, LS2 and LS3 or some of the components G1, G3, CLP, LPF1, LPF2, CLP2, G4 and G5 as described for FIG. 3. In some embodiments, one common bass enhancement processing is made for all channels. The resulting common processed low frequency signal is then combined with each of the multi-channels to form separate processed output multi-channels.

To sum up, the invention provides a method and a device for enhancing low frequency content of an input signal X, e.g. bass boosting of an audio signal. An overdriving ODR of a low frequency signal part LS1 of the input signal X is performed to produce a boosted low frequency signal LS3, wherein the overdriving (ODR) includes amplifying the low frequency signal part (LS1) by a first gain (G1) to form an amplified low frequency signal (LS2), and hard-clipping (CLP) the amplified low frequency signal (LS2) to form the boosted low frequency signal (LS3). A first low-pass filtering LPF1 is then performed, resulting in a processed low frequency signal LS4. A cut-off frequency of the first low-pass filtering LPF1 is selected so as to reduce distortion components introduced by the overdriving ODR. Finally, the processed low frequency signal LS4 is combined with at least part of the input signal X to form an output signal Y. Preferred embodiments further include adding a part of the input signal X after a gain G2, to the low frequency signal part LS1, hereby taking into account possible high frequency peak in the overdriving ODR process. Preferably, a second low-pass filter LPF2 serves to low-pass filter the input signal X to form the low frequency signal part LS1. A second cut-off frequency of the second low-pass filter LPF2 is preferably selected coincident with the first cut-off frequency. Further, the first and second cut-off frequencies are preferably selected equal to, or within one octave from, a low frequency cut-off frequency for a loudspeaker intended to reproduce the output signal Y. Thus, the preferred method introduces a level dependent bass boost below the loudspeaker's low frequency cut-off frequency.

Although the present invention has been described in connection with the specified embodiments, it should not be construed as being in any way limited to the presented examples. The scope of the present invention is to be interpreted in the light of the accompanying claim set. In the context of the claims, the terms "including" or "includes" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A method of enhancing low frequency content of an input signal, comprising:

a) performing a first low-pass filtering of the input signal to provide a low frequency signal part, and combining a portion of the input signal with the low frequency signal part prior to performing an overdriving of a low frequency signal part of the input signal to form a boosted low frequency signal in order to take into account possible high frequency peaks, leading to a lower boost of the low frequency signal, thereby reducing the risk of clipping distortion in the output signal, wherein the overdriving comprises amplifying the low frequency signal part of the input signal by a first gain to form an amplified low frequency signal, and hard-clipping the amplified low frequency signal to form the boosted low frequency signal, b) performing a second low-pass filtering of the boosted low frequency signal to form a processed low frequency signal, wherein a first cut-off frequency of the second low-pass filtering is selected to reduce distortion components introduced by the overdriving, and c) combining the processed low frequency signal with at least part of the input signal to form an output signal.

2. The method according to claim 1, wherein a second cut-off frequency of the second low-pass filtering is substantially equal to the first cut-off frequency of the first low-pass filtering.

3. The method according to claim 1, wherein the first cut-off frequency is selected such that it is within one octave around a low frequency cut-off frequency of an associated electro-acoustic transducer intended to convert the output signal to an acoustic signal.

4. The method according to claim 1, wherein the first gain is in the range +3 dB to +30 dB, such as in the range +6 dB to +20 dB.

5. The method according to claim 1, wherein a second gain is applied to the input signal before being combined with the low frequency signal part, wherein the second gain is in the range −20 dB to 0 dB.

6. The method according to claim 5, wherein the second gain applied to the input signal before being combined with the low frequency signal part is in the range −10 dB to −3 dB.

7. The method according to claim 1, further comprising performing a high-pass filtering of the input signal to form a high frequency signal part prior to combining with the low frequency signal part.

8. The method according to claim 7, wherein step c) includes combining the high frequency signal part with the processed low frequency signal to form the output signal.

9. The method according to claim 1, further comprising applying a third gain of less than zero dB after step a).

10. The method according to claim 1, further comprising performing a signal clipping after the combining in step c).

11. A signal processor arranged to perform the method according to claim 1.

12. A device that comprises the signal processor according to claim 11.

13. The device according to claim 12, wherein the device is an audio device, a communication device, a car audio device, a home audio device, a headphone, a personal computer, a TV set, a personal media player, a gaming console, a hearing aid, or a hi-fi device.

14. A system comprising the device according to claim 12, further comprising an electro-acoustic transducer.

15. A non-transitory, computer readable storage medium with a computer executable program code adapted to perform the method according to claim 1.

* * * * *